METHOD FOR MAKING SEMICONDUCTOR DEVICES

Filed Sept. 30, 1965

INVENTORS
Koichiro Shoda
Kyoji Moriyama

BY Stevens, Davis, Miller & Mosher
ATTORNEYS

United States Patent Office 3,384,518
Patented May 21, 1968

3,384,518

METHOD FOR MAKING SEMICONDUCTOR DEVICES

Koichiro Shoda and Kyoji Moriyama, Suita-shi, Japan, assignors to Matsushita Electronics Corporation, Osaka, Japan, a corporation of Japan Filed Sept. 30, 1965, Ser. No. 491,535
Claims priority, application Japan, Oct. 12, 1964, 39/58,417
8 Claims. (Cl. 148—179)

Figures 1, 2, 3A, 3B, 4A, 4B, 5, 6, 7:
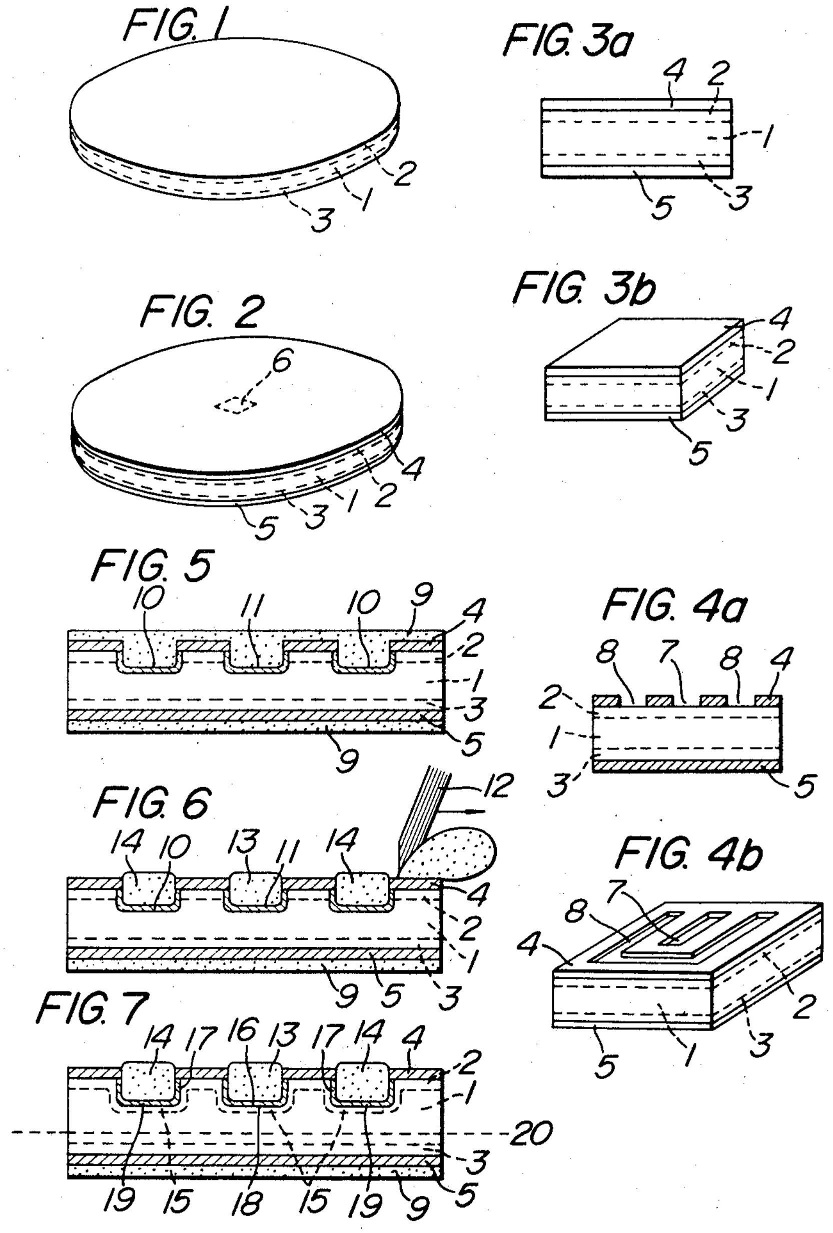

This invention relates to an improved method for making semiconductor devices such as transistors and the like.

In a series of manufacturing processes of transistors and other semiconductor devices, one of the most important processes which determine the electrical performance, yield and so on of semiconductor devices manufactured is the process in which alloying materials are alloyed in a predetermined shape to predetermined positions on the semiconductor material, thereby forming a rectifying and/or a non-rectifying contact therewith.

More particularly, the present invention relates to an improved method for making semiconductor devices for the purpose of forming such rectifying and nonrectifying contacts on a semiconductor material. As is well-known, it is highly desirable, in the manufacture of transistors both for use at high frequencies and for operation at high power, that these contacts are firmly deposited on a semiconductor material and have a very minute size or are shaped with high precision.

It is the primary object of the present invention to provide an improved method for making semiconductor devices by which the rectifying and non-rectifying contacts of a well controlled shape to suit the above described requirements can effectively be formed on a semiconductor material.

Hitherto, several methods for alloying an alloying material in a well controlled shape on a semiconductor wafer for thereby forming a rectifying or non-rectifying contact thereon have been proposed. For example, there has been proposed a method which comprises coating the surface of a semicinductor wafer with a layer of an inactive material such as silicon dioxide $SiO_2$, removing portions of this coating layer to provide holes of desired contact shape, pressing pellets of an alloying material onto the holes while keeping the wafer surface in a clean state, and then heating the wafer to a high temperature to cause flow of the alloying material through the holes so that the pellets of alloying material alloy with the semiconductor wafer to form rectifying and nonrectifying contacts whose shape is controlled by the shape of the holes. This method, however, is uneconomical in that jags of considerably complicated structure and shape are required for the manufacture, in that the surface of semiconductor must be kept in an extremely clean state during the manufacturing process and in that it is yet difficult to obtain a good contact regardless of these efforts. Another method proposed heretofore comprises placing a semiconductor wafer in a vacuum vessel, disposing an alloying material in the same vessel apart from the semiconductor wafer, and heating the alloying material to a high temperature to evaporate so that this evaporated material is deposited, through a metal mask provided with holes of predetermined shape, on the wafer surface to alloy therewith for thereby forming rectifying and/or non-rectifying contacts thereon. This method is also defective in that a lot of labor and time are required for the mask registering, in that the semiconductor surface must be kept in an extremely clean state during the operation and in that mass production can not be expected so much due to the utilization of vacuum evaporation.

The method according to the present invention as will be described later is quite advantageous over the prior methods as described above in that jigs of complicated structure are not required for the production of such semiconductor devices, mass production is possible and contacts exhibiting good electrical and mechanical properties can be obtained.

Briefly, the method for manufacturing semiconductor devices according to the present invention includes applying a thin layer of an inert coating material on the surface of a semiconductor wafer, and opening holes of desired contact shape through the coating layer, thereby exposing portions of the semiconductor wafer surface. In the meantime, a desired alloying material is heated to melt in a bath and ultrasonic vibration is imparted to the bath of molten alloying material, then the above-described semiconductor wafer is immersed in this bath for a short time and then withdrawn. Either immediately after the withdrawal from the alloying bath, or in a later process, the semiconductor wafer is reheater in an inert gas or reducing atmosphere to remelt the alloying material deposited on the wafer surface. Under this state, the alloying material on the exposed portions of the semiconductor wafer is well bonded to the semiconductor to alloy therewith, but the alloying material remaining over the coating layer, except the exposed portions, merely adheres to the coating layer by a weak force while taking the shape of globules to its surface tension, and can therefore easily be removed by imparting impact thereto or by mechanically wiping it off with an edge such as of a razor blade applied thereto. Thus, a rectifying or a non-rectifying contact can easily be formed between the semiconductor and the alloying material.

The above and other objects, advantages and features of the present invention will become obvious from the following description with reference to the accompanying drawings, in which:

FIGS. 1 to 7 are schematic illustrations of successive steps of the method embodying the present invention as applied to the manufacture of germanium alloy diffusion type transistors.

In the embodiments of the invention, the case of alloy diffusion type transistors will mainly be described since the present invention can most effectively be applied to alloy diffusion type transistors among other types. However, it is to be understood that this is by way of example only and the present invention is in no way limited to such specific example.

In the first embodiment of the invention, manufacturing steps for the production of germanium alloy diffusion type transistors will first be described with reference to FIGS. 1 to 7.

In FIG. 1, the body of a thin wafer of p-type germanium is generally designated by reference numeral 1. This wafer 1 has a diameter of 20 to 25 millimeters and is 100 to 200 microns thick. The wafer 1 has a resistivity of several ohm-centimeters. An n-type impurity such as antimony is diffused on both surfaces of the wafer 1 to form n-type diffused layers 2 and 3 thereon. An antimony diffusion depth of 5 to 15 microns and a surface concentration of $10^{16}$ to $10^{17}$ atoms per cc. are preferred.

Then, layers 4 and 5 of inert material are coated on the wafer surfaces as shown in FIG. 2. The term "inert material" is used to mean a material which does not physically and chemically react with both the semiconductor wafer and materials to be alloyed with the semiconductor which will be described later. This inert material layer may preferably be a coating of silicon dioxide $SiO_2$, which can be deposited by subjecting a silane compound such as tetra-ethoxy-silane to pyrolysis at a temperature of several hundred degrees centigrade. A coating thickness of 0.5 to 2 microns is preferred. An excessively great coating thickness will result in a difficulty of obtaining a firm bond between the coating layer and the semiconductor due to thermal expansion mismatch between them and in a difficulty of acquiring required precision in opening holes of desired shape as by the photoetching process, while an excessively thin coating thickness will result in an insufficient surface protecting action. Several hundreds of transistors can be made from this single semiconductor wafer 1. These transistors in such a great number are treated at a time in the form of a wafer until they are separated from one another in a later step. A square shape 6 in dotted lines in FIG. 2 conceptionally shows that a minute portion in the wafer 1 is corresponding to the area 6 of one transistor element. The portion 6 corresponding to one transistor element area in FIG. 2 is shown in an enlarged scale in FIG. 3*b* for convenience of explanation, and FIG. 3*a* represents a sectional view of the transistor element of FIG. 3*b*.

In the subsequent step, a well-known technique called the photoetching process comprising coating, exposing, and developing photoresist lacquer on the wafer, and partly removing the inert coating layer by hydrofluoric acid is applied so that portions of the inert coating layer 4 are removed in the desired contact shape to obtain exposed wafer faces 7 and 8 as shown in FIG. 4.

Meanwhile, an alloy consisting of lead which acts as a carrier metal and antimony in an amount of a few percent which is to serve as an n-type impurity is heated to melt in a crucible at a temperature of 500° C. and, while imparting ultrasonic vibration to the molten alloy through the medium of the crucible wall, the semiconductor wafer 6 is immersed in the bath of molten alloy. According to the study by the inventors, a good result was obtained with ultrasonic vibration at a frequency of 40 kilocycles per second. It was also found out that better wetting between the alloy and the semiconductor could be obtained by adding tin, silver or gold in an amount of less than 1% to the alloy. By the immersion in the alloy bath being subjected to ultrasonic vibration, those semiconductor portions which are exposed from the inert coating layer dissolve into the molten alloy. The amount of this semiconductor dissolution is an important factor in the manufacturing method according to the invention, and it is necessary that this dissolution treatment is effected to an extent that the exposed surface portions of the semiconductor are dissolved to a depth of 5 to 20 microns, that is, until the n-type prediffusion layer at the surface is completely dissolved away. However, it is necessary to shallow the above-described dissolution depth in case of making non-rectifying contacts, for example, on a double diffusion type transistor in which the diffusion layer is extremely thin.

The state of the semiconductor wafer when it is withdrawn from the molten alloy bath is as shown in FIG. 5 in which it will be seen that the upper and lower surfaces of the wafer are entirely covered with layers of the alloying material 9. In this case, the alloying material does not alloy with the inert coating layers 4 and 5 but merely mechanically attaches thereto. On the other hand, due to the above dissolution of the semiconductor into the alloy bath, the alloying material 9 is brought into contact with the p-type semiconductor wafer 1 and the diffused n-type layer 2 and forms thin recrystallized layers 10 and 11 at the boundaries therebetween. A preferred time of immersion of the wafer in the molten alloy bath is of the order of 10 to 30 seconds. An excessively long immersion time will result in breakage of the inert coating layer. An $SiO_2$ coating with a film thickness of the order of 0.7 micron can sufficiently withstand immersion up to 30 seconds. The action of cavitation caused by the ultrasonic vibration in this particular manufacturing step is so effective that not only inclusion of air bubbles or undesirable impurities in the alloying material 9 or its boundary layers 10 and 11 can be avoided but also undesirble impurities deposited around the boundary layers are removed into the alloy bath and thus the alloying process is carried out at a sufficiently clean state. It is a specific feature of the present invention that those portions of the semiconductor wafer which are exposed from the inert coating layer are dissolved away in a considerable amount into the molten alloy bath, as described above.

As will be apparent from the above embodiment, according to the invention, reaction between a simi-conductor wafer and an alloying material takes place in a bath containing the molten alloying material of a great amount and under a state in which ultrasonic vibration is continuously imparted to the bath. Therefore, the inventive method is free from a prior defect as, for example, experienced with the method of heating alloying pellets merely placed on a semiconductor wafer, in which the alloying material is immediately saturated with the semiconductor dissolved from the wafer with the result that the semiconductor ceases to dissolve any further.

In the method according to the invention, the semiconductor at the exposed portions can be removed over a desired depth by suitably controlling the time of immersion. The alloying material intrudes, with high precision and by being aided by ultrasonic vibration, into the recesses formed at the exposed portions of the semiconductor to be positively alloyed with the semiconductor. Therefore, an extremely firm bond is provided between the semiconductor and this alloying material by alloying therebetween and the alloying material is bonded to the semiconductor in a highly precise shape.

In the subsequent step, the semiconductor wafer is reheated in an inert or reducing gas atmosphere at a temperature of 500 C. to remelt the alloying material and mechanical means is applied to remove solely those portions of the alloying material which exist on the inert coating layer 4. This can be done, for example, by applying an elongated, linear, sharp edge 12 such as a razor blade on the surface of the wafer and moving it in a direction of arrow as shown in FIG. 6. The remaining portions 13 and 14 of the alloying material are further treated in a later step to provide the emitter and base electrodes of transistor, respectively. This removing operation on the alloying material can more conveniently be effected when the width of the electrodes 13 and 14 is as narrow as possible. With a groove width of 100 microns, for example, the alloying treatment according to the invention could sufficiently be carried out and the removing operation was also facilitated. Though the alloying material may remain in a very small amount at places on the inert coating layer 4 even after the removing step by the sharp edge, this remaining material may be etched off in a later step for complete removal. In lieu of the above manner of removal by use of a sharp edge, a method may be employed in which a centrifugal force is imparted to the semiconductor wafer in its heated condition in order to utilize a difference in the force of adhesion between the alloyed portions and the mere attaching portions for the removal of the alloying material existing on the inert coating layer 4.

Of the three deposits of alloying material 14, 13 and 14 in FIG. 6, the alloying material deposit 13 which is to serve as the emitter is doped with a p-type impurity such as boron or aluminum. This doping operation consists of dispersing boron or aluminum powder in a higher alcohol of somewhat viscous nature, coating this dispersion on the alloying material deposit by means such as a pincette, and heating the semiconductor wafer for several to ten minutes at a temperature of 600° C. to 800° C. in an inert or reducing gas atmosphere such as nitrogen gas or forming gas (a gas mixture of nitrogen and hydrogen). By this doping treatment, a semiconductor structure as shown in FIG. 7 can be obtained. In FIG. 7, the n-type impurity, antimony, having a greater diffusion coefficient than that of the p-type impurity predominantly diffuses beneath the alloying material deposits 13 and 14 to form n-type regions 15 thereat. Since the alloying material deposit 13 alone of the three alloying material deposits includes the p-type impurity such as aluminum or boron having greater solid solubility, a recrystallized p-type layer 16 is formed in the course of its recrystallization and a p-n emitter rectifying contact or an emitter junction 18 is formed at the interface between the recrystallized p-type layer 16 and the diffused n-type region 15. On the other hand, since the alloying material deposit 14 includes therein only antimony as an impurity, a recrystallized n-type layer 17 is formed at the portion at which this alloying material deposit contacts the semiconductor and thus a non-rectifying base contact 19 is formed thereat, which is to be connected through the preliminarily diffused n-type region 2 with the diffused n-type base layer beneath the emitter junction. These steps finally provide a p-n-p type transistor. Thereafter the portion lying below a broken line 20 of the wafer 1 is removed off so as to attach a collector contact thereto.

The above steps are performed on each transistor element of the wafer including a multiplicity of continuously arranged transistor elements. As is commonly known, the semiconductor wafer is thereafter diced into pieces to obtain a multiplicity of transistor elements. On the lower face of the wafer body 1 of each transistor element, a metal plate serving as a combination collector electrode and collector heat sink is provided, while leads are attached to the emitter electrode 13 and the base electrode 14 on the upper face of the wafer body 1.

The inert coating layer 4 may be left as it is for the purpose of surface protection when lower breakdown voltage is allowable, but where higher breakdown voltage is needed it is preferable that the inert coating layer 4 is completely removed by use of hydrofluoric acid and the entire surface of the semiconductor is lightly etched also by this acid so that portions with a high impurity concentration on the semiconductor surface may be removed.

A second embodiment of the present invention will next be described. The second embodiment relates to a process for the manufacture of silicon alloy diffusion type transistors. The process for the manufacture of silicon alloy diffusion type transistors is substantially the same as that of the germanium alloy diffusion type transistors previously described. Therefore, the manufacturing steps are almost the same with those given in the above explanation with reference to FIGS. 1 to 7. In the case of silicon, however, starting material is a wafer of n-type silicon. The inert coating layer in this case may be provided by first forming a pre-diffused p-type layer on the n-type silicon wafer and then subjecting a silane compound to pyrolysis, or alternatively by heating the wafer at a high temperature in an oxidizing atmosphere to cause thermal growth of an $SiO_2$ coating layer. Further, tin is preferred as a carrier metal and may be doped with an n-type impurity, such as arsenic or antimony, of an amount of the order of 0.5% to provide the alloy. This alloy is heated to melt to provide a molten alloy bath to which ultrasonic vibration is likewise imparted and the semiconductor wafer is immersed in the bath. In this case, addition of gold in a small amount or less than 1% to this alloy is preferable in order to obtain better wetting of the silicon wafer by this alloy and the desired treatment can sufficiently be attained with the molten alloy bath at a temperature of the order of 500° C. and with immersion for about 20 seconds in the molten alloy bath subjected to ultrasonic vibration.

After the alloying treatment on specified portions by the ultrasonic vibration, a dispersion consisting of p-type impurities, both boron and aluminum powders dispersed in a higher alcohol of somewhat viscous nature is added to the alloying material deposit which is to serve as the base, and the semiconductor wafer is heated at 1,120° C. for about 5 minutes in an $N_2$ gas or forming gas (a gas mixture of $N_2$ and $H_2$) atmosphere so that required alloy diffusion is thereby effected. On this occasion, aluminum alone of the said p-type impurities added to the alloying material turns into aluminum nitride by reacting with the $N_2$ gas and a certain amount thereof is carried in the gaseous state into the alloying material deposit 14 which is to serve as the emitter. Thus, aluminum having greater diffusion coefficient diffuses fast to form the p-type regions not only beneath the alloying material deposit which is to act as the base but also beneath the alloying material deposit which is to act as the emitter. On the other hand, that portion of the emitter-forming alloying material which is in contact with the semi-conductor is turned into a recrystallized n-type layer in the course of its recrystallization by the presence of the n-type impurity, antimony or arsenic, having greater solid solubility and thus a rectifying contact is formed at the emitter between the recrystallized n-type layer and the above-described diffused p-type region. Meanwhile, due to the addition of boron, having greater solid solubility than antimony which is an n-type impurity, to the alloying material deposit which is to act as the base, that portion of the base-forming alloying material which is in contact with the semiconductor is turned into a recrystallized p-type layer and thus a non-rectifying contact is formed at the base which is connected through the pre-diffused p-type region with the diffused p-type base layer beneath the emitter junction. In this manner, n-p-n transistors can be obtained.

From the foregoing detailed description with regard to the two embodiments of the present invention, it will be appreciated that the method according to the invention has the notable effects as described below:

(1) Even a very minute electrode can be formed with high precision as well as with any shape by virtue of the use of a molten metal bath under ultrasonic vibration. The method of this invention is therefore suitable for the production of large power transistors as well as high-frequency transistors.

(2) Since an alloying material is brought into contact, in the form of a molten alloy bath under ultrasonic vibration, with those portions of the semiconductor which are exposed from an inert coating layer, it is possible to highly precisely control the rate of dissolution of the exposed portions of the semiconductor into the alloy bath to an amount of desired thickness and to precisely force the alloying material into the recesses formed by the dissolution of the semiconductor by virtue of ultrasonic vibration to thereby cause the alloying material to firmly alloy with the semiconductor.

(3) The method of the invention is quite suitable for mass production since it eliminates the elaborate step of vacuum evaporation including evacuation and mask registering, or conventional alloying process needing complex jigs, large alloying oven and so on, and the alloy bath treatment requires only a short time.

An advantage derivable from the method according to the invention is that tin or indium besides aluminum can easily be combined with silicon to alloy therewith, whereas it has been a common practice to exclusively employ aluminum for an alloying material to be alloyed with silicon because aluminum is most easily combined with silicon.

Although the above embodiments of the present invention have referred to a case of production of alloy diffusion type transistors, it will be understood that the invention is not confined to the production of such alloy diffusion type transistors and the method disclosed herein is also applicable to the formation of a rectifying contact in a conventional alloy type transistor and a non-rectifying contact in a conventional double diffusion type transistor.

What is claimed is:

1. A method for making semiconductor devices comprising the steps of forming a thin layer of inert coating material on the surface of a semiconductor wafer, forming openings of desired contact shape through portions of the said coating layer, and immersing the said semiconductor wafer for a short time in a molten alloy bath, which is prepared by heating to melt an alloying material and to which ultrasonic vibration is continuously imparted, thereby causing those portions of the said semiconductor which are exposed through the openings through said coating layer on the said semiconductor wafer to dissolve into the molten alloying material in the said alloy bath by such an amount as to provide recesses of a certain depth and causing the said alloying material and the said semiconductor to alloy with each other to form a recrystallized layer covering the entire surface of each recess provided by the dissolution of the said semiconductor.

2. A method for making semiconductor devices comprising the steps of forming a thin coating layer of silicon dioxide on the surface of a semiconductor wafer, forming openings of desired contact shape through portions of the said coating layer, and immersing the said semiconductor wafer for a short time in a molten alloy bath, which is prepared by heating to melt an alloying material and to which ultrasonic vibration is continuously imparted, thereby causing those portions of the said semiconductor which are exposed through the openings through said coating layer on the said semiconductor wafer to dissolve into the molten alloying material in the said alloy bath by such an amount as to provide recesses of a certain depth and causing the said alloying material and the said semiconductor to alloy with each other to form a recrystallized layer covering the entire surface of each recess provided by the dissolution of the said semiconductor.

3. A method for making semiconductor devices comprising the steps of forming a thin coating layer of silicon dioxide on the surface of a semiconductor wafer, forming openings of desired contact shape through portions of the said coating layer, and immersing the said semiconductor wafer for a short time in a molten alloy bath, which is prepared by heating to melt an alloying material, the said alloy containing a metal selected from the group consisting of tin, silver and gold in an amount less than 1% by weight, and to which ultrasonic vibration is continuously imparted, thereby causing those portions of the said semiconductor which are exposed through the openings on said coating layer on the said semiconductor wafer to dessolve into the molten alloying material in the said alloy bath by such an amount as to provide recesses of a certain depth and causing the said alloying material and the said semiconductor to alloy with each other to form a recrystallized layer covering the entire surface of each recess provided by the dissolution of the said semiconductor.

4. A method for making semiconductor devices comprising the steps of forming a thin coating layer of silicon dioxide on the surface of a semiconductor wafer, forming openings of desired contact shape having a width less than 100 microns through portions of the said coating layer, and immersing the said semiconductor wafer for a short time in a molten alloy bath, which is prepared by heating to melt an alloying material and to which ultrasonic vibration is continuously imparted, thereby causing those portions of the said semiconductor which are exposed through the openings through said coating layer on the said semiconductor wafer to dissolve into the molten alloying material in the said alloy bath by such an amount as to provide recesses of a certain depth and causing the said alloying material and the said semiconductor to alloy with each other to form a recrystallized layer covering the entire surface of each recess provided by the dissolution of the said semiconductor.

5. A method for making semiconductor devices comprising the steps of forming a coating layer 0.5 to 2 microns thick of silicon dioxide on the surface of a semiconductor wafer, forming openings of desired contact shape through portions of the said coating layer, and immersing the said semiconductor wafer for a short time in a molten alloy bath, which is prepared by heating to melt an alloying material to be and to which ultrasonic vibration is continuously imparted, thereby causing those portions of the said semiconductor which are exposed through the openings through said coating layer on the said semiconductor wafer to dissolve into the molten alloying material in the said alloy bath by such an amount as to provide recesses of a predetermined depth and causing the said alloying material and the said semiconductor to alloy with each other to form a recrystallized layer covering the entire surface of each recess provided by the dissolution of the said semiconductor.

6. A method for making semiconductors devices comprising the steps of forming a coating layer 0.5 to 2 microns thick of silicon dioxide on the surface of a semiconductor wafer, forming openings of desired contact shape having a width less than 100 microns through portions of the said coating layer, immersing the said semiconductor wafer for a short time of 10 to 30 seconds in a molten alloy bath, which is prepared by heating to melt an alloying material, the said alloy containing a metal selected from the group consisting of tin, silver, and gold in an amount less than 1% by weight, and to which ultrasonic vibration is continuously imparted, thereby causing those portions of the said semiconductor which are exposed through the openings through said coating layer on the said semiconductor wafer to dissolve into the molten alloy in the said alloy bath by such an amount as to provide recesses of a predetermined depth and causing the said alloying material and the said semiconductor to alloy with each other to form a recrystallized layer covering the entire surface of each recess provided by the dissolution of the said semiconductor, and subjecting the said semiconductor wafer processed by the above treatment to a heat treatment at a temperature of 600° C. to 800° C. for several to ten minutes in an atmosphere of inert gas.

7. A method for making semiconductor devices comprising the steps of forming a thin coating layer of silicon dioxide on the surface of germanium wafer, forming openings of desired contact shape through portions of the said coating layer, and immersing the said semiconductor wafer for a short time in a molten alloy bath, which is prepared by heating to melt a lead-antimony alloy or indium and to which ultrasonic vibration is continuously imparted, thereby causing those portions of the said semiconductor which are exposed through the openings through said coating layer on the said semiconductor wafer to dissolve into the molten alloy in the said alloy bath by such an amount as to provide recesses of a certain depth and causing the said alloy and the said semiconductor to alloy with each other to form a recrystallized layer covering the entire surface of each recess provided by the dissolution of the said semiconductor.

8. A method for making semiconductor devices comprising the steps of forming a thin coating layer of silicon dioxide on the surface of silicon wafer, forming openings of desired contact shape through portions of the said coating layer, and immersing the said semiconductor wafer for a short time in a molten alloy bath, which is prepared by heating to melt at least one metal to be alloyed with the said semiconductor, the said metal being selected from the group consisting of tin, aluminum, indium, arsenic, antimony and lead, and to which ultrasonic vibration is continuously imparted, thereby causing those portions of the said semiconductor which are exposed through the openings through said coating layer on the said semiconductor wafer to dissolve into the molten alloying material in the said alloy bath by such an amount as to provide recesses of a certain depth and causing the said alloying material and the said semiconductor to alloy with each other to form a recrystallized layer covering the entire surface of each recess provided by the dissolution of the said semiconductor.

References Cited

UNITED STATES PATENTS

| | | | |
|---|---|---|---|
| 3,192,082 | 6/1965 | Tomono et al. | 148—1.5 |
| 3,219,497 | 11/1965 | Shannon | 148—184 |
| 3,272,669 | 9/1966 | Im | 148—179 |
| 3,306,835 | 2/1967 | Magnus | 148—1.5 |

HYLAND BIZOT, *Primary Examiner.*

RICHARD O. DEAN, *Examiner.*